United States Patent [19]

Miesterfeld

[11] 4,021,681
[45] May 3, 1977

[54] RESONANT SENSOR USING A PHASE LOCKED LOOP DETECTOR

[75] Inventor: Frederick Otto Richard Miesterfeld, Troy, Mich.

[73] Assignee: Chrysler Corporation, Highland Park, Mich.

[22] Filed: Jan. 22, 1976

[21] Appl. No.: 651,384

[52] U.S. Cl. .......................... 307/233 A; 324/161; 328/149; 307/282
[51] Int. Cl.[2] ................... H03D 13/00; H03K 5/20
[58] Field of Search ..................... 307/233 A, 282; 324/161, 173; 330/107; 328/140, 659; 329/104, 112

[56] References Cited

UNITED STATES PATENTS

| | | | |
|---|---|---|---|
| 3,286,191 | 11/1966 | Cornwell | 307/233 A |
| 3,614,615 | 10/1971 | Cass | 324/161 |
| 3,820,024 | 6/1974 | Wise et al. | 324/173 |

Primary Examiner—Stanley D. Miller, Jr.
Assistant Examiner—B. P. Davis
Attorney, Agent, or Firm—Talburtt & Baldwin

[57] ABSTRACT

A speed sensor circuit for providing a speed signal representative of the speed of a vehicle comprises a resonant tank circuit whose resonant frequency is modulated in accordance with the speed of the vehicle and a phase locked loop detector circuit which locks onto the frequency of the resonant tank circuit and provides a demodulated output signal representative of the vehicle speed.

13 Claims, 2 Drawing Figures

RESONANT SENSOR USING A PHASE LOCKED LOOP DETECTOR

BACKGROUND AND SUMMARY OF THE INVENTION

This invention relates to a speed sensor circuit which is particularly well suited for providing a speed signal representative of the speed of a vehicle.

One type of prior magnetic speed sensor for a vehicle utilizes a relatively small impedance pick-up which experiences a relatively small magnetic flux change. Because of the small flux change, this sensor gives only a relatively small output signal. Moreover, because of the small impedance pick-up significant drive current is required. Even where a pair of pick-ups are used in a differential system, appreciable drive current is needed.

Briefly, the present invention provides an improved speed circuit which may be utilized to advantage in automotive vehicle applications, such as in a vehicle speed control system. One advantage of a circuit embodying principles of the present invention is that a high degree of accuracy is obtained with relatively small amount of circuit hardware. Another advantage is that a compact pick-up device may be used. Furthermore, because only minimal drive current is required, the circuitry may be constructed from currently available microcircuit devices thereby permitting compact packaging of the electronics. The invention provides high sensitivity, and in the exemplary preferred embodiment wherein the pick-up is magnetically coupled with a transmission gear, can operated with a substantial air gap between the pick-up and the gear. Overall the invention provides a compact, economical speed sensing circuit which may be incorporated not only in an automotive vehicle, but in other applications as well where a speed signal is desired.

The foregoing features and advantages and benefits of the invention, along with additional ones, will be seen in the ensuing description and claims which are to be considered in conjunction with the accompanying drawing wherein there is illustrated a preferred embodiment of the invention according to the best mode presently contemplated in carrying out the invention.

CROSS REFERENCE TO RELATED APPLICATION

The present application is related to the application of Stephen J. Orris and Frederick O. R. Miesterfeld, Ser. No. 651,385 entitled "Speed Sensor" filed on even date herewith and assigned to the same assignee as the present application.

DESCRIPTION OF THE PREFERRED EMBODIMENT

Figure 1:
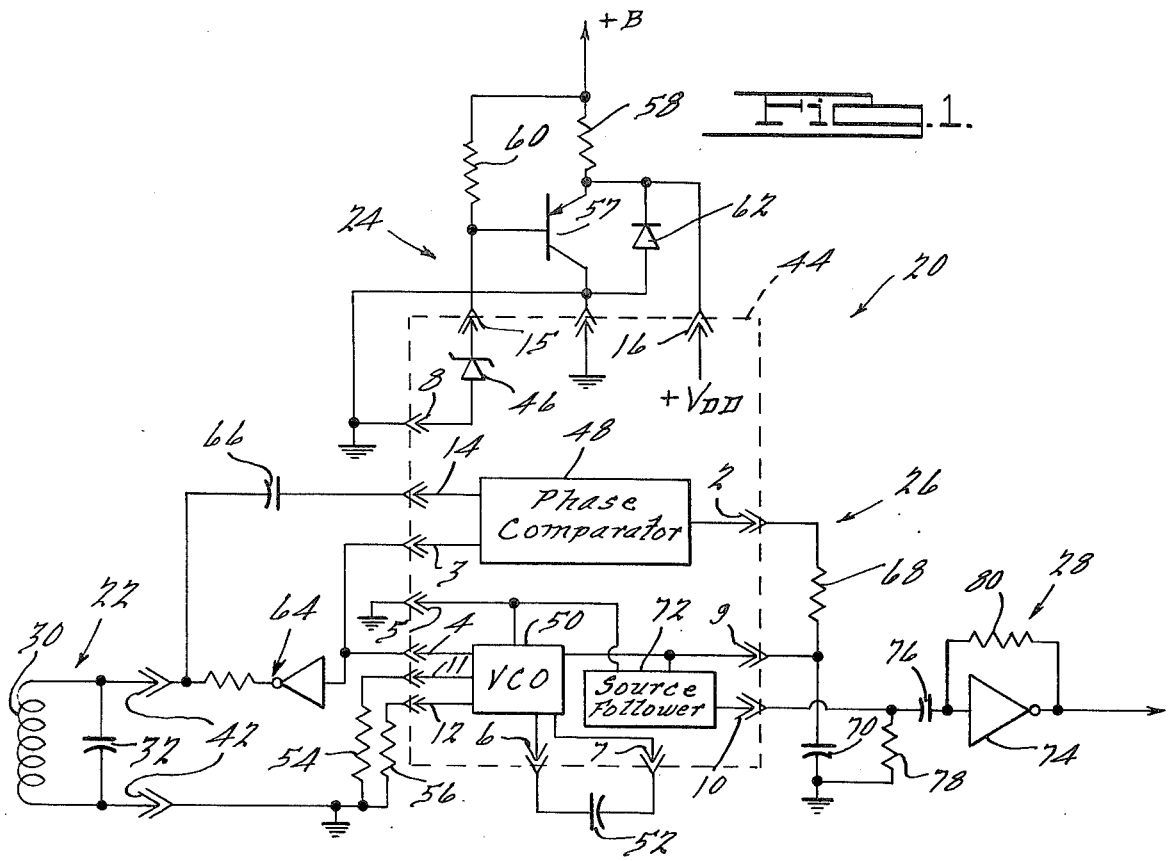
FIG. 1 is an electrical schematic diagram of a speed sensing circuit embodying principles of the present invention.
Figure 2:
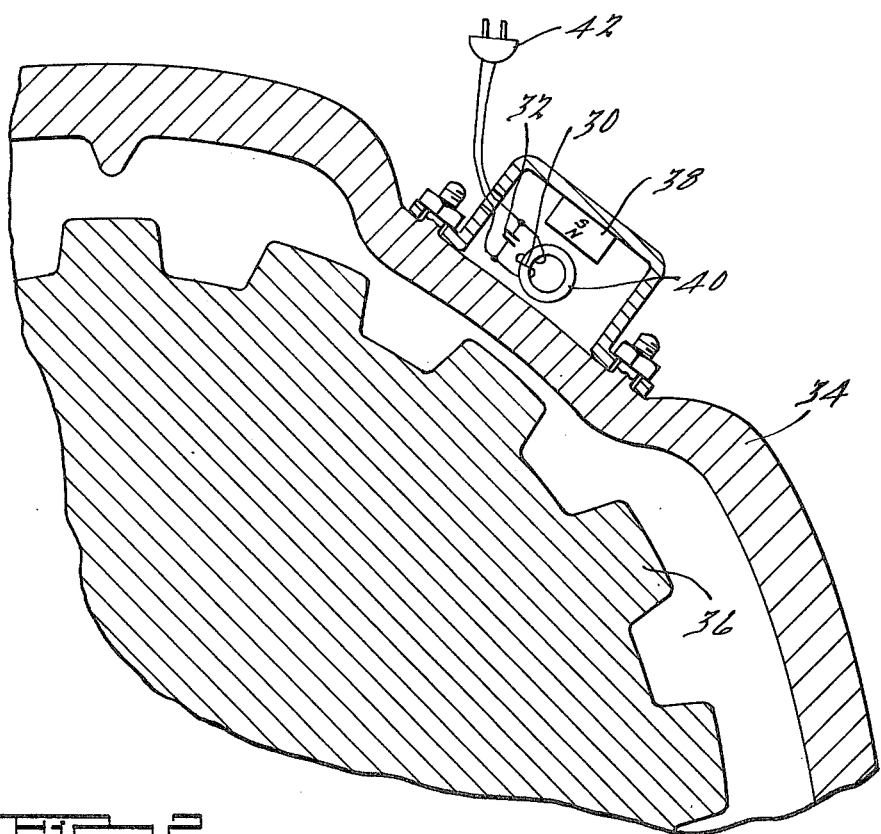
FIG. 2 is a fragmentary sectional view through a pick-up device mounted on a vehicle transmission and utilized in the circuit of FIG. 1.

In FIG. 1, a speed sensor circuit 20 embodying principles of the present invention comprises a resonant tank circuit 22, a regulated DC power supply circuit 24, a phase locked loop detector circuit 26, and a frequency-to-voltage converter circuit 28. Resonant tank circuit 22 comprises an inductive coil 30 and a capacitor 32 which are connected in parallel. The tank circuit forms a part of a pick-up, a preferred construction for which is illustrated in FIG. 2 wherein the pick-up is mounted on the aluminum casing 34 of a vehicle transmission. The pick-up is located in proximity to a toothed ferromagnetic gear 36 within casing 34, which gear rotates in unison with the rear wheels of the vehicle. The pick-up includes a permanent magnet 38, and coil 30 is wound on a toroidal ferromagnetic core 40. The arrangement provides a magnetic circuit with gear 36 wherein movement of the gear teeth past the pick-up creates a variable magnetic flux density in inductive coil 30 thereby making the inductance of the coil variable. The frequency at which the inductance is varied is a function of the rotational speed of gear 36 and hence provides an indication of vehicle speed. By connecting capacitor 32 in parallel with coil 30, a resonant tank circuit is formed whose resonant frequency varies with vehicle speed. The pair of lead wires from capacitor 32 and coil 30 are brought out through a suitable opening in the side wall of the pick-up housing to a connector plug 42 which connects to the electronic circuitry which may be remotely located from the pick-up. Further details of the pick-up may be obtained from the above cross-referenced application which discloses and claims the pick-up device.

In FIG. 1, a portion of the electronic circuitry contained within the broken line is provided by an integrated circuit 44. By way of example, the specific device utilized in the preferred embodiment is an RCA integrated circuit No. CD4046, which is of C-MOS construction. The terminal pin designations shown on the drawing for integrated circuit 44 correspond to the manufacturer's designations. Terminal pin 8 is the negative polarity power supply terminal and terminal pin 16, the positive polarity supply terminal. A zener diode 46 connects between terminal pin 8 and terminal pin 15. The integrated circuit further includes a phase comparator 48 having a pair of inputs at terminal pins 3 and 14, and an output at terminal pin 2. A voltage controlled oscillator 50 has a control voltage input at terminal pin 9. The frequency range of oscillator 50 is established by an external capacitor 52 connected between terminal pins 6 and 7 and a resistor 54 connected between terminal pin 11 and the negative polarity supply terminal. An offset resistor 56 connects between terminal pin 12 and the negative polarity supply terminal.

In order to develop a well-regulated DC supply voltage of appropriate potential for application across terminal pins 16 and 8, circuit 24 comprises an emitter-follower circuit operatively coupled with zener diode 46. This emitter-follower circuit comprises a PNP transistor 57 having its emitter connector through a resistor 58 to the positive terminal of the vehicle battery. An input circuit for the base of transistor 57 is provided by zener diode 46 and an external resistor 60 connected as illustrated so that the zener voltage is supplied to the base of transistor 57. The collector of transistor 57 connects to the vehicle battery negative terminal and the emitter-collector circuit is shunted by a diode 62. The emitter of transistor 57 connects to terminal pin 16 of integrated circuit 44. The negative power supply terminal of the integrated circuit and the vehicle battery negative terminal are illustrated at a common potential. With this arrangement, the voltage at the emitter of transistor 57 is closely regulated by zener diode 46 to thereby supply a well-regulated supply voltage of the appropriate potential across terminals 16 and 8 of the integrated circuit.

Terminal pin 4 of voltage controlled oscillator 50 is coupled directly to one input terminal pin of comparator 48 and also through a driver circuit 64 to one side of the resonant tank circuit. The other side of the resonant tank circuit is connected to the negative supply terminal. The ungrounded side of the resonant circuit is coupled through a coupling capacitor 66 to the other input terminal pin of comparator 48. A low pass filter composed of a resistor 68 and a capacitor 70 is connected with terminal pins 2 and 9 and with the negative supply terminal as shown.

Integrated circuit 44 further contains a source follower circuit 72 having its input connected with terminal pin 9 and its output, via terminal pin 10, with frequency-to-voltage converter circuit 28.

Circuit 28 comprises an inverting amplifier 74 having its input coupled through a capacitor 76 to terminal pin 10 of integrated circuit 44. A load resistor 78 for the output of source follower 72 connects between terminal pin 10 and the negative power supply terminal. A resistor 80 is connected between the input and output of inverting amplifier 74.

In operation, voltage controlled oscillator 50 develops a square wave output voltage waveform at terminal pin 4 which, for a given value of resistors 54 and 56 and capacitor 52, is determined by the magnitude of the voltage control signal applied to terminal pin 9. While the circuit is closed-loop in that phase comparator circuit 48 is connected to adjust the signal at terminal pin 9 in accordance wiht the signals supplied to terminal pins 3 and 14, operation of the circuit may be more readily understood by considering the open-loop operation with the loop being opened at terminal pin 9. For a given magnitude of control voltage applied to terminal pin 9, voltage controlled oscillator 50 will develop at terminal pin 4 a square wave output at a corresponding frequency. As the magnitude of the control signal at terminal pin 9 changes, so does the frequency of the output voltage signal at terminal pin 4. This signal is supplied to one input of phase comparator 48. In addition, this signal is used to drive resonant tank circuit 22 at the same frequency. Driver circuit 64, which is illustrated as an inverter and resistor, precludes loading of the output of voltage controlled oscillator 50. However, driver circuit 44 itself may be of microcircuit (for example C-MOS also) construction since negligible driver current is required. If the resonant frequency of tank circuit 22 does not coincide with the frequency of the output waveform of voltage controlled oscillator 50, the signal generated at the output of phase comparator circuit 48 which will be of a magnitude which will tend to bring the frequency of the voltage controlled oscillator waveform into correspondance with the resonant frequency of tank circuit 22. Thus, when the loop is closed, the circuit will lock onto the frequency of the resonant tank circuit and will track changes in the frequency of the resonant tank circuit which occur as gear 36 rotates. Where the teeth of gear 36 are of generally uniform width and spacing, the reluctance of the magnetic circuit, and hence the resonant frequency of tank circuit 22, may be considered as experiencing approximately sinusoidal oscillations as the gear teeth sweep past the pickup. Because the frequency of the output waveform of the voltage controlled oscillator 50 is much greater than the frequency of these sinusoidal signals from the resonant circuit, the voltage controlled oscillator waveform is effectively frequency modulated by the sinusoidal variations in frequency of the resonant circuit created by rotation of gear 36. The low pass filter defined by resistor 68 and capacitor 70 operates to demodulate the modulated waveform so that a sinusoidal signal whose frequency is representative of the speed of gear 36 appears at terminal pin 9. Source follower 72 follows this signal to provide a corresponding sinusoidal signal to the input of frequency-to-voltage converter circuit 28. Circuit 28 in turn develops at the output of amplifier 74 (which may also be of C-MOS construction) a voltage whose magnitude increases with increasing frequency of the demodulated signal and hence is representative of the speed of gear 36. In this way, the circuit develops a voltage signal whose magnitude is representative of the speed of the vehicle.

The circuit possesses excellent sensitivity because a small change in resonant frequency of the pick-up produces a large phase angle change to which the phase locked loop detector is responsive. Thus, the pick-up can be especially compact, particularly requiring only a small inductance, and the circuit can operate accurately even where there is a large air gap between the transmission gear and the pick-up. In the case where the lengths of the lead wires emanating from the pickup are sufficiently long to create some distributed line inductance, a series resonating capacitor may be connected in series with one of the lead wires to compensate for this line inductance, for example, between the junction of driver stage 64 and capacitor 66 and the output terminal connector plug into which the corresponding terminal of plug 42 is mated.

What is claimed is:
1. A speed sensor circuit for providing a speed signal representative of the speed of an object whose speed is to be measured comprising:
   a resonant tank circuit;
   means for modulating the resonant frequency of said tank circuit in accordance with the speed of the object whose speed is to be measured;
   and a phase locked loop circuit comprising oscillator means providing an oscillating signal, means for locking said oscillating signal onto the resonant frequency of said resonant tank circuit comprising means for driving said resonant tank circuit from said oscillating signal and feedback loop closure means operatively coupled with said oscillator means and said resonant tank circuit for causing the frequency of said oscillating signal to track the resonant frequency of said resonant tank circuit whereby the frequency of said oscillating signal is modulated in accordance with modulation of said resonant tank circuit by the object whose speed is to be measured, and including demodulator circuit means for demodulating said oscillating signal to thereby develop said speed signal.
2. A speed sensor circuit as claimed in claim 1 wherein said oscillator means comprises a voltage controlled oscillator supplying said oscillating signal at the output thereof and said driving means comprises a driver circuit having an input receiving said oscillating signal and an output coupled to said resonant tank circuit.
3. A speed sensor circuit as claimed in claim 2 wherein said feedback loop closure means comprises a phase comparator operatively coupled with said reso- nant tank circuit and said voltage controlled oscillator such that said oscillating signal and the signal at the output of the driver circuit are compared by said phase comparator and said phase comparator supplies an output signal as a feedback input for said voltage controlled oscillator for causing the frequency thereof to track the frequency of the resonant tank circuit.

4. A speed sensor circuit as claimed in claim 3 wherein said demodulator circuit means comprises a low pass filter operatively coupled to receive the output signal of said phase comparator and to supply the demodulated signal as the feedback input to said voltage controlled oscillator.

5. A speed sensor circuit as claimed in claim 4 further including a frequency responsive circuit operatively coupled with said low pass filter to provide an output voltage signal whose magnitude varies in accordance with the frequency of the demodulated signal.

6. A speed sensor circuit as claimed in claim 2 wherein said voltage controlled oscillator is contained on an integrated circuit and is programmed via external resistor and capacitor means.

7. A speed sensor circuit as claimed in claim 1 wherein said resonant tank circuit comprises a toroidal core inductor and a capacitor connected in parallel with each other.

8. A speed sensor circuit as claimed in claim 7 wherein said means for modulating the resonant frequency of said resonant tank circuit in accordance with the speed of the object whose speed is to be measured comprises means for varying the magnetic flux density within said torodial core inductor in accordance with the speed of the object whose speed is to be measured.

9. A speed sensor circuit as claimed in claim 8 wherein the magnetic flux in said torodial core inductor is provided by a permanent magnet and a reluctor wheel rotating at a speed related to the speed of the object whose speed is to be measured is coupled in magnetic circuit with said permanent magnet and said torodial core inductor such that the flux density through the torodial core inductor is varied in accordance with the speed of said reluctor wheel.

10. A speed sensor circuit as claimed in claim 9 wherein said reluctor wheel comprises a gear of a vehicle transmission.

11. A speed sensor circuit as claimed in claim 1 wherein said resonant tank circuit includes a toroidal core inductor.

12. A speed sensor circuit as claimed in claim 11 wherein said modulating means comprises a toothed rotary ferromagnetic member inductively coupled with said toroidal core inductor for modulating the inductance of said inductor according to the rotational speed of said rotary ferromagnetic member.

13. A speed sensor circuit as claimed in claim 12 wherein said resonant tank circuit also includes a capacitor means electrically connected in parallel with said toroidal core inductor and wherein both said inductor and said capacitor means are disposed in immediate proximity to said toothed rotary ferromagnetic member.

* * * * *